US007442560B2

(12) United States Patent
Asada

(10) Patent No.: US 7,442,560 B2
(45) Date of Patent: Oct. 28, 2008

(54) METHOD FOR MANUFACTURING ANISOTROPIC CONDUCTIVE SHEET

(75) Inventor: Norihiro Asada, Kitakatsushika-gun (JP)

(73) Assignees: Micro Precision Co. & Ltd., Tokyo (JP); Okins Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/581,852

(22) PCT Filed: Nov. 30, 2004

(86) PCT No.: PCT/JP2004/017783

§ 371 (c)(1),
(2), (4) Date: Jun. 5, 2006

(87) PCT Pub. No.: WO2005/055252

PCT Pub. Date: Jun. 16, 2005

(65) Prior Publication Data

US 2007/0158759 A1 Jul. 12, 2007

(30) Foreign Application Priority Data

Dec. 4, 2003 (JP) ............................ 2003-405851

(51) Int. Cl.
*G01R 31/26* (2006.01)

(52) U.S. Cl. ........................................................ 438/17

(58) Field of Classification Search .................. 438/17, 438/18; 257/48
See application file for complete search history.

(56) References Cited

U.S. PATENT DOCUMENTS 5,188,702 A * 2/1993 Takayama et al. ............. 216/18

FOREIGN PATENT DOCUMENTS

| | | | |
|---|---|---|---|
| JP | 56/48951 | | 11/1981 |
| JP | 2001/291430 | | 10/2001 |
| JP | 2003/121468 | | 4/2003 |
| JP | 2003-121468 | * | 4/2003 |

OTHER PUBLICATIONS

Kovacs et al., "Bulk Micromachining of Silicon", Aug. 1998, Proceedings of the IEEE, vol. 86, No. 8, pp. 1536-1551.*

* cited by examiner

*Primary Examiner*—Charles D. Garber
*Assistant Examiner*—Reema Patel
(74) *Attorney, Agent, or Firm*—James Creighton Wray; Clifford D. Hyra

(57) ABSTRACT

In order to provide an anisotropic conductive sheet which can be applied to more finely and more narrowly pitched electrodes and also to provide spring electrodes applied for the anisotropic conductive sheet, the spring electrodes manufactured as follows. A part having a bending leaf spring shape is formed out of a monocrystal silicon by anisotropic etching and gold is plated on the surface of the part so as to obtain a silicon spring electrode 1. The silicon spring electrodes 1 are inserted in through holes formed on a silicone rubber sheet and fixed to the through holes.

1 Claim, 3 Drawing Sheets

METHOD FOR MANUFACTURING ANISOTROPIC CONDUCTIVE SHEET

This application claims the benefit of Japanese Application No. 2003-405851 filed Dec. 4, 2003 and PCT/JP2004/017783 filed Nov. 30, 2004, which are hereby incorporated by reference in their entirety.

FIELD OF THE INVENTION

The present invention relates to an anisotropic conductive sheet which employs silicon spring electrodes.

RELATED BACKGROUND ART

The anisotropic conduction sheet is employed in a final conducting test step of a semiconductor device which has been more and more highly integrated, and employed in an electrical connection between the semiconductor device and a printed circuit board. Various types of anisotropic sheets have been proposed and some of them are practically used, but on the whole anisotropic sheets may be classified into two groups. One of the types is called a pressure sensitive conductive rubber. As shown in FIG. 6, such sensitive conductive rubber is constituted by dispersing fine particles 62 formed out of a conductive material in a rubber 61. When the rubber 61 is compressed, the fine particles 62 are contacted each other, so that the rubber 61 becomes conductive (conventional example 1). The idea of the above-mentioned conductive rubber is rather old one, as you can find such idea in a patent application filed in 1973 and granted as a patent right (see Japanese patent application published No. 56-48951). Afterward various efforts have been made to disperse conductive fine particles as uniformly as possible so that the pressure sensitive conductive rubber has been practically used.

As shown in FIG. 7, another type of the anisotropic conductive sheets comprises a soft rubber 71 and gold plated fine metal wires 73 which are densely arranged in the soft rubber 71 (conventional example 2). Since solder bumps of a semiconductor package are pressed against the anisotropic conductive sheet in order to make the semiconductor package electrically conductive, gold plated fine metal wires vertically arranged in the soft rubber are inappropriate, so that an anisotropic conductive sheet having an offset arrangement such that metal wires are slantingly arranged in the soft rubber has been practically used and now it is supposed to be used more frequently.

Since the number of pins of semiconductor packages have been increasing due to the fact that semiconductor devices have been more densely integrated, solder bumps have been employed in most of the semiconductor packages in place of the pins. When heights of the solder bumps with good precision are attempted to manufacture, costs will be increased remarkably high, so that the heights the solder bumps are controlled within a predetermined error. Such solder bumps can not attain good electrical contacts with electrodes arranged on a flat plane, so that the semiconductor packages can not inspected perfectly. Therefore, flexibility as well as a reliable conductivity are required in the anisotropic conductive sheet. Since the solder bumps are pressed against the anisotropic conductive sheet, vertically arranged fine metal wires are inappropriate, so that slantingly arranged fine metal wires are employed instead in order to reduce pressures between the solder bumps and the anisotropic conductive sheet.

DISCLOSURE OF THE INVENTION

Problems to be Solved by the Invention

Only when electrodes are in contact with both sides of an anisotropic conductive sheet constituted by a pressure sensitive rubber, electrical contacts between the anisotropic conductive sheet and the electrodes cannot be attained. In order to attain the electrical contacts, the electrodes should be pressed against the anisotropic conductive sheet. When the electrodes are pressed with a pressure more than a certain level against the anisotropic conductive sheet, the electrical contacts are attained. When recently most frequently employed (semi-spherical) solder bumps are pressed against the anisotropic conductive sheet, pressures in lateral directions and in oblique directions are exerted on the anisotropic conductive sheets in lateral directions. Consequently, since electrical contacts in unexpected directions are formed when the solder bumps are pressed, a problem of crosstalk will be caused. Due to this problem, the pressure sensitive rubber without any modifications cannot be applied to narrowly pitched electrodes of highly integrated recent semiconductor packages. In order to cope with the problem, an anisotropic conductive sheet, which comprises pressure sensitive conductive rubbers arranged with the same pitch as the electrodes and insulating resins arranged between neighboring pressure sensitive conductive rubbers, is employed as a standard anisotropic conductive sheet. However, it is easily understood that the size of the pressure sensitive conductive rubber and the pitch for precisely arranging the pressure sensitive conductive rubber, will reach to their respective limits sooner or later.

In anisotropic conductive sheet in which file metal wires are slantingly arranged, the offset arrangement should be considered from a structural viewpoint. Heights of solder bumps are not strictly controlled, but there are differences in the heights as a matter of course, so that a certain extent of pressure should be applied to the anisotropic conductive sheet in order to make all electrodes conductive. When the pressure is applied, the fine metal wires slantingly arranged in the soft rubber are slanted more, so that the anisotropic conductive sheet shows a larger offset arrangement. An offset extent is not constant in each electrode, but it depends on the pressure exerted on the electrode. Judging from the fact that the offset extent is not constant in each electrode, it is obvious that there is a limit to narrow the arranging pitch of the electrodes.

The present invention is carried out in view of the above-mentioned problems in order to provide an anisotropic conductive sheet which can be applied to more finely and more narrowly pitched electrodes for conductive test.

Means to Solve the Problems

In order to solve the above-mentioned problems, a mehtod for manufacturing an anisotropic conductive sheet by the present invention is constituted as specified in (1).

(1) A method for manufacturing an anisotropic conductive sheet comprising: step A; etching through a monocrystal silicon wafer by a deep reactive ion etching so as to form a part having a bending leaf spring shape such that planes of the formed leaf spring are parallel to a cross section of the wafer, step B; forming a silicon spring electrode by forming a conductive layer on a surface of the part having the bending leaf spring shape formed in step A, and step C; inserting a plurality of the silicon spring electrodes formed in step B respectively into through holes of a soft plastic sheet such that the spring electrodes are clamped and fixed to the soft plastic sheet.

Effects Attained by the Invention

The present invention can provide the anisotropic conductive sheets which can be applied to electrodes arranged with a finer and narrower pitch and can provide the electrodes to be applied to the anisotropic conductive sheets by the present invention.

Hereinafter, related backgrounds of the present invention are explained in detail. Idealistic springs can be formed out of a monocrystal silicon, since it shows no fractures corresponding to fatigues in metals and no plastic deformations. Since a pattern can be transferred to the monocrystal silicon by a photolithographic process as used in the semiconductor manufacturing process, more finely processed products, which are unable to obtain by a machining process, can be obtained so that springs applicable to electrodes with a finer and narrower pith can be obtained. In addition, if the spring is formed smaller, the number of the springs obtained from one silicon wafer is increased, which means manufacturing cost for each spring is lowered, so that it can be anticipated that a manufacturing cost of the anisotropic conductive sheet is not so raised even if the number of the electrodes are increased. On the other hand, if such fine electrodes are manufactured by the conventional machining process, the manufacturing cost for each spring is raised and the manufacturing cost of anisotropic conductive sheet is remarkably raised as the number of the electrodes is increase.

EXPLANATION OF REFERENCE CHARACTERS

1 silicon spring electrode

3 anisotropic conductive sheet

PREFERRED EMBODIMENT BY THE PRESENT INVENTION

The preferred embodiments by the present invention are explained as referring to drawings.

Embodiment 1

Figure 1:
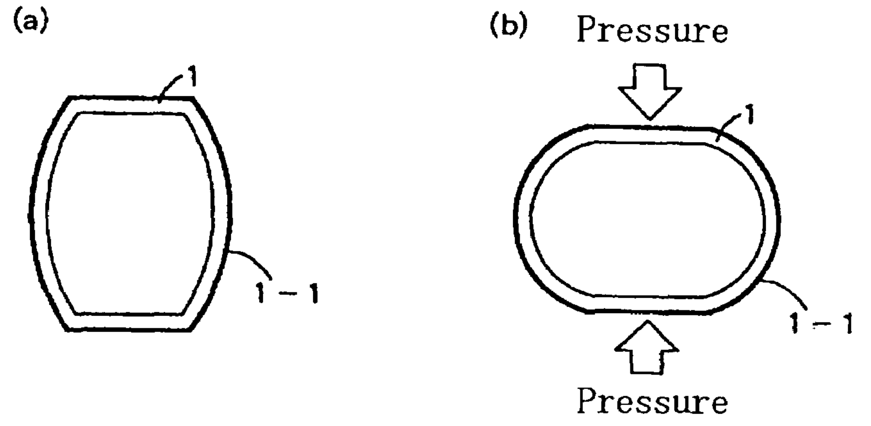
FIG. 1 is a cross-sectional view showing a shape of a silicon spring electrode employed in embodiment 1.
Figure 2:
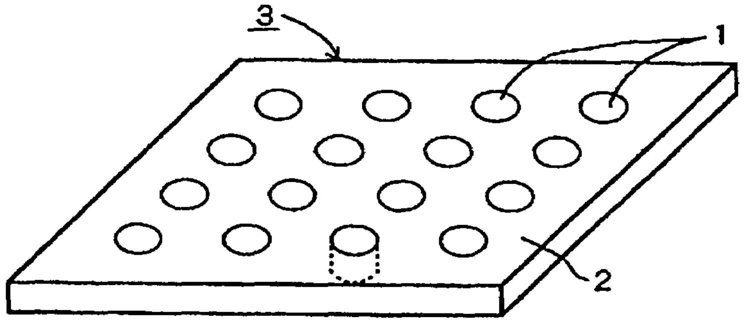
FIG. 2 is a perspective view showing an arrangement of embodiment 1.

FIG. 1 is the cross-sectional view showing the shape of the silicon spring electrode employed in “an anisotropic conductive sheet” as embodiment 1. A spring electrode 1 shown in FIG. 1 is formed out of a monocrystal silicon into a ring-like bending leaf spring. FIG. 2 is the perspective view showing the arrangement of the present embodiment. As shown in FIG. 2 silicon spring electrodes 1 are fixed in through holes of a silicon rubber sheet 2.

Prior to explaining embodiment 1 in detail, reasons why the spring electrode is formed out of the monocrystal silicon and reasons why the spring is formed in a shape of the ring-like bending leaf spring, are explained.

Since silicon atoms of the monocrystal silicon are bonded covalently, the monocrystal silicon is a brittle material. However, when it is formed into a thin or fine structure, a quite flexible property is endowed to it, which means it is an excellent spring material. In addition, since the monocrystal silicon shows no fatigues as observed in polycrystal metal materials, components formed out of the monocrystal silicon can be used eternally as far as a force causing an excessive stress leading to a fracture is not exerted to the components, so that the monocrystal silicon is a suitable spring material for micromachining devices.

Incidentally, since the monocrystal silicon is a material for semiconductors, it is not suitable to use as a conductive material for contact points and the like. However, it can be used as a conductive material by forming a metal thin film on its surface. As a method for forming the metal thin film, a plating method is mostly employed among chemical methods and the metal thin film is formed by this method at a low cost. Among physical method methods, a sputtering method is mostly employed and adhesiveness of a thin film formed by this method is excellent.

One of the methods for processing the monocrystal silicon is an etching method which is employed in semiconductor manufacturing processes. Recently, a deep RIE (reactive ion etching) method is frequently used as a micromachining so that the monocrystal silicon, which is a brittle material, can be processed with good precision into a desired shape. An expandable electrode structure like a spring is obtained such that the ring-like shape as shown in FIG. 1 is formed on the monocrystal silicon by the photolithography and then the formed ring-like shape is etched through by the deep PIE. When the electrode structure made of silicon is plated with gold, which is soft and stainless, an expandable electrode, namely, a spring electrode is finished.

When the spring electrodes are embedded in or molded in a soft plastic sheet, an anisotropic conductive sheet is obtained. The obtained anisotropic conductive sheet allows electric currents to flow only from the front surface to the rear surface of the sheet or vice versa.

In addition to the above-mentioned reason why the monocrystal silicon is employed, another reason is that a technology for manufacturing quite small parts has already established. If small parts are manufactured by a technology called a micromachining, micrometer-sized parts with good precision can be obtained and such parts can be mass-produced quite easily.

On the whole springs are classified into two types. One is a coil spring and the other is a leaf spring. When the coil spring is applied to the anisotropic conductive sheet, an electric current flows in a sort of coil so that an inductance and a capacitance generated in the coil spring are unfavorable. Because recently, most of the signals processed by semiconductors are high-frequency signals, the generated inductance and capacitance in the coil retard transfer rates of such signals, which must be avoided. And since it is difficult to reduce the size of the coil spring much smaller to a micrometer level, the coil spring is not applied to the present invention. The leaf spring is applied to the present invention, because generating inductance and capacitance in the leaf spring are quite small owing to its structure.

Figure 4:
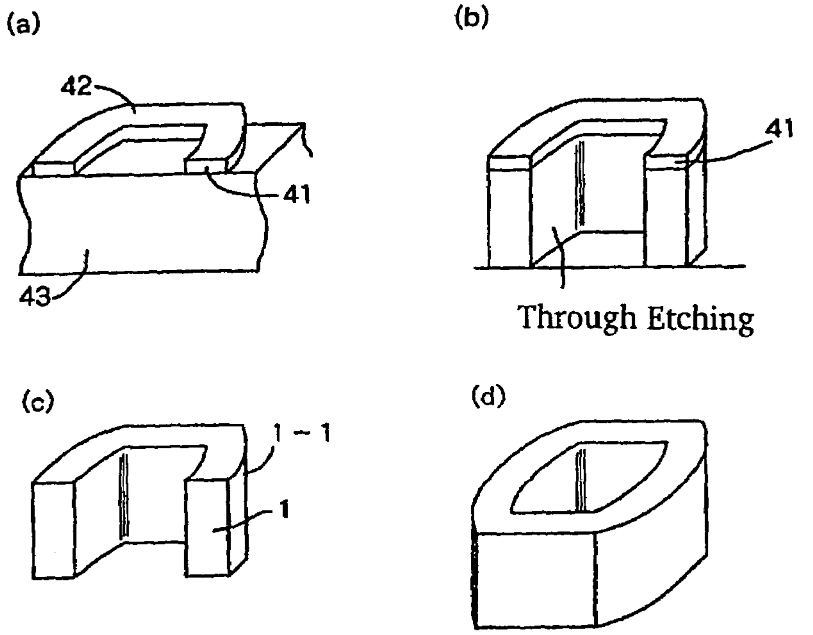
FIG. 4 illustrates manufacturing steps of the silicon spring electrode employed in embodiment 1.

FIG. 4 illustrates manufacturing steps of the silicon spring electrode employed in embodiment 1. In order to describe the manufacturing steps more understandable, drawings in FIG. 4 are illustrated as cross-sectional perspective views. As shown in FIG. 4(*a*), a photo mask having holes exactly corresponding to a cross-sectional shape of the silicon spring electrode 1 is mounted on a monocrystal silicon wafer 43, and then a pattern 42 of a photo resist 41 is transferred on the silicon wafer 43 by a photolithography step. As shown in FIG. 4(*b*), the silicon wafer 43 as is, on which the pattern 42 is transferred, is etched through by the deep RIE. After the through etching all silicon spring are cleaned. In the next step, the silicon spring is plated with gold (metal thin film coating) as shown in FIG. 4(*c*). FIG. 4(*d*) is a perspective view of a finished silicon spring electrode.

The silicon spring electrodes 1 manufactured in the above-mentioned way are inserted through holes with a predetermined pitch (random pitches are also acceptable) formed in the silicone rubber sheet 2 as shown in FIG. 2, so that the anisotropic conductive sheet by the present embodiment is finished. Since the size of through holes formed in the silicone rubber sheet 2 is slightly smaller than the size of the silicon spring electrode 1, the silicon spring electrode 1 is clamped by the silicone sheet 2 and fastened to the through hole so that the silicon spring electrode is not unfastened.

Figure 3:
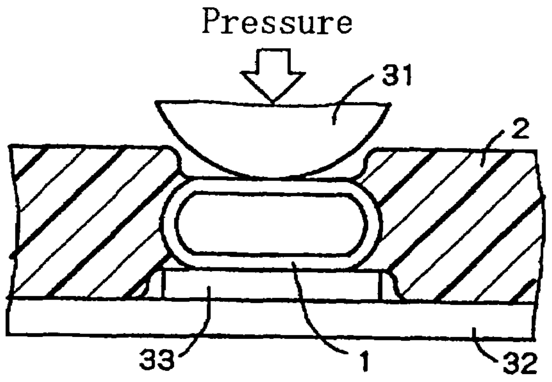
FIG. 3 is a cross-sectional view illustrating an applied status of embodiment 1.

FIG. 3 illustrates a connecting state of a solder bump 31 of a semiconductor device package to an electrode 33 formed on a printed circuit board 32 via the silicon spring electrode 1 of the anisotropic conductive sheet 3 by the present embodiment. As shown in the drawing, when the solder bump 31 exerts a pressure on the silicon spring electrode 1, both side walls of the silicon spring electrode 1 expand outward as pressing the silicone rubber sheet 2. Thus an electrical connection between the solder bump 33 and the electrode 33 is maintained without changing a flowing direction of electric current. The silicon spring electrode 1 is designed such that an enough margin against a fracture when the silicon spring electrode 1 is deformed to the utmost, is maintained.

As explained above, it is obvious that no crosstalk among the silicon spring electrodes is observed owing to the structure of the silicon spring electrode by the present embodiment. Since it is possible to manufacture a silicon spring electrode with the size of some micrometers, it is possible to provide an anisotropic conductive sheet having more finely and more narrowly pitched silicon spring electrodes than before. In addition, the silicon spring electrodes can be manufactured by a batch process, a unit price of the silicon spring electrode is not raised, so that the total costs for manufacturing the anisotropic sheet are not raised.

Embodiment 2

Figure 5:
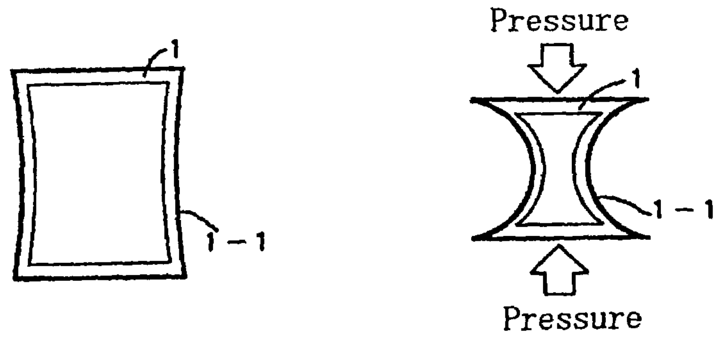
FIG. 5 is a cross-sectional view showing a shape of a silicon spring electrode employed in embodiment 2.
Figure 6:
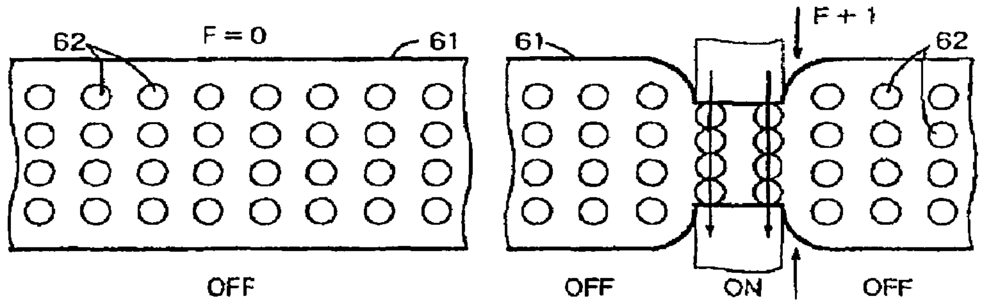
FIG. 6 PRIOR ART
FIG. 6 illustrates the constitution of the conventional example 1.
Figure 7:
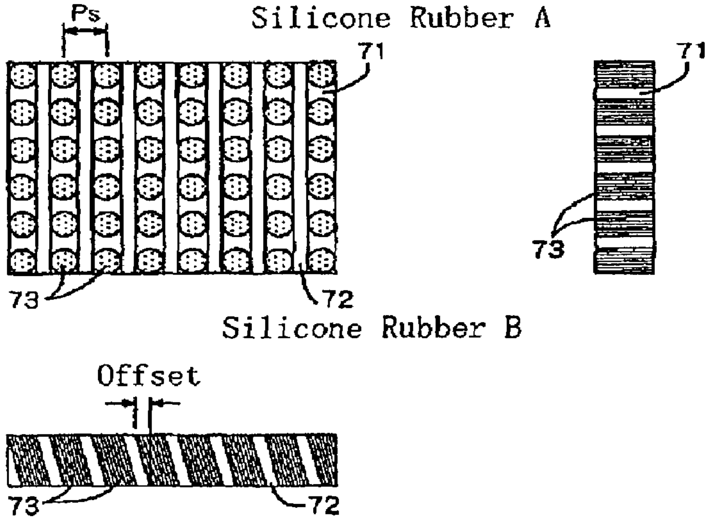
FIG. 7 PRIOR ART
FIG. 7 illustrates the constitution of the conventional example 2.

FIG. 5 is the cross-sectional view showing the shape of the silicon spring electrode employed in an anisotropic conductive sheet of embodiment 2. As shown in the drawing, the spring electrode shows a shape of a bending leaf spring which is made out of a monocrystal silicon. The appearance of the silicon spring electrode by the present embodiment shows a sandglass like shape as shown in FIG. 5. Since except the appearance manufacturing steps of the silicon spring electrodes and the silicone sheet, usage of the silicon sheet and the like are the same as those of embodiment 1, further explanations are omitted.

In respective embodiments, the silicon spring electrodes with ring-like cross-sections are used, but the cross-section is not limited to this shape, a C-shaped cross-section, a zigzag-shaped cross-section or the like may be employed in the silicon spring electrode. Methods for forming conductive layers on the silicon spring electrodes are not limited to gold plating, but appropriate metals and means may be employed for forming the conductive layers.

What is claimed is:

1. A method for manufacturing an anisotropic conductive sheet comprising:

step A; etching through a monocrystal silicon wafer by a deep reactive ion etching so as to form a part having a bending leaf spring shape such that planes of said formed leaf spring are parallel to a cross section of said wafer, step B; forming a silicon spring electrode by forming a conductive layer on a surface of said part having the bending leaf spring shape formed in step A, and step C; inserting a plurality of said silicon spring electrodes formed in step B respectively into through holes of a soft plastic sheet such that said spring electrodes are clamped and fixed to said soft plastic sheet and do not extend out of the holes during operation.

* * * * *